(12) United States Patent
Tauzin

(10) Patent No.: US 8,993,408 B2
(45) Date of Patent: Mar. 31, 2015

(54) METHOD FOR DETACHING A SILICON THIN FILM BY MEANS OF SPLITTING, USING TRIPLE IMPLANTATION

(75) Inventor: Aurelie Tauzin, Saint Egreve (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 515 days.

(21) Appl. No.: 13/390,601

(22) PCT Filed: Aug. 25, 2010

(86) PCT No.: PCT/FR2010/051774
§ 371 (c)(1),
(2), (4) Date: Feb. 15, 2012

(87) PCT Pub. No.: WO2011/023905
PCT Pub. Date: Mar. 3, 2011

(65) Prior Publication Data
US 2012/0138238 A1      Jun. 7, 2012

(30) Foreign Application Priority Data
Aug. 26, 2009   (FR) ...................................... 09 55826

(51) Int. Cl.
*H01L 21/30* (2006.01)
*H01L 21/762* (2006.01)

(52) U.S. Cl.
CPC ................................ *H01L 21/76254* (2013.01)
USPC ....................................................... 438/455

(58) Field of Classification Search
CPC .................... H01L 21/76254; H01L 21/2007; H01L 21/30604; H01L 21/187; H01L 21/67092; H01L 21/324; H01L 27/14692; H01L 21/26506; H01L 21/76251; H01L 41/319
USPC .......................................... 438/455; 156/711
See application file for complete search history.

(56) References Cited

U.S. PATENT DOCUMENTS

| | | | |
|---|---|---|---|
| 5,877,070 A | 3/1999 | Goesele et al. | |
| 7,262,466 B2 * | 8/2007 | Aitken et al. | 257/347 |
| 2004/0224482 A1 | 11/2004 | Kub et al. | |
| 2005/0026426 A1 | 2/2005 | Maleville et al. | |
| 2006/0148208 A1 * | 7/2006 | Popov et al. | 438/458 |
| 2007/0141802 A1 * | 6/2007 | Gadkaree | 438/455 |
| 2010/0041218 A1 * | 2/2010 | Hatem et al. | 438/513 |

FOREIGN PATENT DOCUMENTS

EP      1798765      6/2007

OTHER PUBLICATIONS

Bruno et al. "He implantation in Si for B diffusion control" Nuclear Instruments and Methods in Physics Methods Research 257:-2, pp. 181-185, Apr. 1, 2007.

* cited by examiner

*Primary Examiner* — Duy T Nguyen
(74) *Attorney, Agent, or Firm* — Occhiuti & Rohlicek LLP

(57) ABSTRACT

A process for detaching a silicon thin film from a donor substrate by cleaving, includes implanting species within the donor substrate to form a weak layer. The species are implanted at a depth at least equal to the thickness of the thin film to be detached. There is a heat treatment at 450° C. or more and cleaving is along the weak layer. The implanting species includes implanting boron, helium and hydrogen with implantation energies such that: helium and boron concentration maxima are obtained at substantially the same depth, separated by at most 10 nm; and a hydrogen concentration maximum is obtained at a depth at least 20 nm greater than that of the helium and boron concentration maxima. The implantation dose of boron is at least equal to $5 \times 10^{13}$ B/cm$^2$ and the dose of helium and hydrogen is at least $10^{16}$ atoms/cm$^2$ and at most $4 \times 10^{16}$ atoms/cm$^2$.

10 Claims, 1 Drawing Sheet

METHOD FOR DETACHING A SILICON THIN FILM BY MEANS OF SPLITTING, USING TRIPLE IMPLANTATION

CROSS REFERENCE TO RELATED APPLICATIONS

This application is the national stage entry under 35 USC 371 for PCT/FR2010/051774, filed Aug. 25, 2010, which claims the benefit of the Aug. 26, 2009 priority date of French application Ser. No. 09/55826. The contents of both the foregoing applications are incorporated herein by reference.

The invention relates to a process for detaching a thin film from a substrate, implementing implantation of several species and having a controlled sensitivity to high-temperature heat treatments.

The technique of detaching a thin film from a substrate using implantation of a suitable species to form a weakened layer is especially described in document U.S. Pat. No. 5,374,564 (Gruel) and documents that relate to improvements thereto, such as document U.S. Pat. No. 6,020,252 (Aspar). This process is widely employed under the name "Smart Cut™".

PRIOR ART

The Smart Cut™ process allows a thin film to be detached and transferred to a carrier by way of the following steps:
1. bombarding one side of an initial substrate (typically made of silicon) with gaseous species (H, or noble gases such as helium) in order to implant these ions in a sufficient concentration to create (after an optional heat treatment) a layer of microcavities and therefore a weakened layer;
2. bringing this side of the substrate into intimate contact with a carrier (in practice another substrate, for example also made of silicon), especially by direct or molecular bonding (the heat treatment mentioned in step 1 may be a heat treatment carried out after this intimate contacting in order to strengthen the direct bonding); and
3. cleaving at the microcavity layer by application of an annealing heat treatment and/or a detaching stress (for example insertion of a blade between the two substrates and/or application of tensile and/or flexural and/or shear stresses and/or application of ultrasound or microwaves of judiciously chosen power and frequency); in this way a thin film (the initial substrate layer under which the microcavities were created) and a remnant substrate are obtained (in view of the thinness of the thin film, the thickness of this remnant substrate is little decreased in practice); and
4. recycling the substrate (namely the remnant of step 3) for a new implanting, contacting and cleaving cycle, and so on.

Step 1 generally consists in implanting hydrogen or helium, typically at an energy of 10 to 210 keV and at a dose of a few $10^{16}/cm^2$ to a few $10^{17}/cm^2$. Step 3, the cleaving step, may then correspond essentially (a moderate amount of another form of energy may also be used) to an annealing heat treatment at a temperature ranging from 200 to 700° C. depending on the chosen implantation conditions (energy, dose, temperature, ion flux, etc.). The time taken for this heat treatment to obtain the cleave depends on the temperature of this annealing treatment (and on the implantation conditions and on whether the optional bond-strengthening anneal or any other heat treatment was carried out beforehand). Generally, all other things being equal, the higher the annealing temperature, the shorter the time required by the anneal to obtain the cleave (see especially: Kinetics of Splitting in the Smart Cut™ Process, Aspar et al., Proceedings 1998 IEEE International SOI Conference, October 1998, pp. 137-138).

Certain applications, such as the transfer of heterostructures (Ge on Si or GaN on sapphire) require the cleaving anneal to be carried out at a very low temperature so as to limit the mechanical stresses due to the difference in the thermal expansion of the joined materials. In other applications, before the cleaving, components may be at least partially formed on the future thin film, even though these components cannot withstand high temperatures. In this respect, various modifications make it possible to decrease the temperature of the cleaving treatment without however requiring that this cleaving treatment be unacceptably long from an industrial standpoint. Thus it is known from the documents:
APL 72, p. 49, 1998; and
U.S. Pat. No. 5,877,070 (Goesele et al.)
that coimplantation of boron and hydrogen makes it possible to decrease the temperature of the cleaving anneal to as low as 200° C. and that the cleave may then be obtained in 24 h for example.

Likewise, it is known that coimplantation of helium and hydrogen makes it possible to decrease the cleaving temperature, whilst at the same time requiring an industrially acceptable duration (see especially: C. Lagahe-Blanchard et al., Proceedings on the Semiconductor Wafer Bonding VII: Science, Technology, and Applications, Paris, France, 27 April-2 May 2003, Electrochemical Society, Pennington, N.J., 2003, Vol. PV2003-19, p. 346, or P. Nguyen et al., Proceedings of the 2003 IEEE International SOI Conference, Newport Beach, Calif., 29 Sep.-2 Oct. 2003 IEEE, Piscataway, N.J., 2003, p. 132).

The reader may also refer to documents U.S. Pat. No. 6,600,173 (Tiwari), WO 2004/042779 (SOITEC-CEA), WO 2004/044976 (CEA), WO 2005/013318 (SOITEC), or WO 2004/043615 (SOITEC-CEA) or the article entitled "Efficient production of silicon-on-insulator films by co-implantation of He with $H^+$" by Agarwal et al. (Applied Phys Letters, Vol. 72, No. 9, March 1998).

It should be noted that, in this context, the main aim of implanting boron or helium in combination with hydrogen is to make the cleaving easier (or to improve the surface quality) by advantageously decreasing the total implantation dose and/or the thermal budget required for the cleave.

In contrast, for certain applications, it is necessary to implement steps involving a high-temperature heat treatment after the implantation but before the cleaving or even before the bonding. The contribution to the cleaving of the cleaving heat treatment can then be significant only if the temperature of this cleaving heat treatment is sufficiently high relative to those of the previous steps. It should be recalled in this respect that the direct bonding of step 2 will be all the better (higher bonding forces) for having been strengthened at a high temperature. By way of example, the higher the thermal budget (high temperature, long time) of the cleaving anneal compatible with the application considered, the stronger the bond formed before the cleaving and therefore the higher the quality of the transferred film (in particular as regards the bonding thereof to the carrier). For other applications, a high-temperature oxide (HTO) deposit, for example 2 to 3 µm in thickness and produced at 700° C., on implanted wafers (and therefore especially on the substrate from which it is desired to detach a thin film), may be necessary to enable bonding of the wafers. However, application of high temperatures may lead to very short cleaving times which are not industrially applicable. Furthermore, it is necessary to guarantee that the cleaving does not occur during a heat treatment prior to the step provided for obtaining this cleave.

It should be specified here that, generally, at the present time, it is sought to detach thin films that may be of very different thicknesses, especially thin films of very small thickness, less than 2 μm in thickness or even less than 300 nm in thickness, while guaranteeing that the surface finish of the sides exposed by the detachment is sufficiently good that long and costly surface finishing steps are not required.

Technical Problem and Solution of the Invention

It will have been understood that it is thus necessary to carry out, after an implantation step, technological steps involving a high thermal budget (especially at temperatures above 450° C. to 500° C.) without causing damage to the surface (via formation of blisters or via exfoliation) while allowing a thermal cleave (possibly at a high temperature, applied for an industrially compatible time) or a well-controlled subsequent mechanical cleave, including when it is necessary to detach particularly thin films.

This is why the object of the invention is to provide a process for detaching, via implantation, which is compatible with high-temperature heat treatments, typically at above 500° C., implemented during technological steps (typically formation of epitaxial films or components, etc.) or during the cleaving step, including when thin films of very small thickness (smaller than 300 nm) are concerned.

Generally, the invention aims to retard the cleaving so that the thermal detachment can be carried out at a high temperature and for a sufficiently long (and therefore industrially compatible) time. This therefore amounts to the inverse of the approach that consisted in implanting hydrogen and boron or helium so as to make a detaching cleave possible at low temperatures.

For this purpose, the invention provides a process for detaching a thin film of silicon from a donor substrate by cleaving, comprising:
- a step of implanting species within the donor substrate, through a free surface, with a view to forming a weak layer, the donor substrate being, at least in its part located below the free surface, over a depth at least equal to the thickness of the thin film, made of silicon, to be detached;
- at least one intermediate step involving a heat treatment at a temperature of at least 450° C.; and
- a step of detachment by cleaving along the weak layer, characterized in that the implantation step comprises implanting boron, helium and hydrogen in any order with implantation energies such that:
  - helium and boron concentration maxima are obtained at substantially the same depth, separated by at most 10 nm; and
  - a hydrogen concentration maximum is obtained at a depth at least 20 nm greater than that of the helium and boron concentration maxima,
- and with implantation doses such that:
  - the boron dose is at least equal to $5 \times 10^{13}$ B/cm$^2$; and
  - the total dose of helium and hydrogen is at least equal to $10^{16}$ atoms/cm$^2$ and at most equal to $4 \times 10^{16}$ atoms/cm$^2$, even $3 \times 10^{16}$ atoms/cm$^2$.

The invention is applicable to any type of silicon: single-crystal, polycrystalline or amorphous silicon, whether doped or not.

It will be understood that, especially for detachment of large-thickness (typically more than 2 microns thick) thin films, it may not be necessary to provide a step of bonding (via intimate contact) to a carrier.

It should be noted that this process essentially copies the conventional steps of the process currently known by the name Smart Cut™, except for step 1.

This is because step 1 comprises, according to the invention, implanting the three following ionic species: boron, helium and hydrogen, with a number of quite precise conditions governing these implantations.

As is known, boron is a species of different nature to that of hydrogen and helium, which are gases the atoms of which are smaller.

As indicated above, it is already known to implant helium in combination with hydrogen. It is also already known to implant boron in combination with hydrogen. However, these coimplantations are essentially proposed with a view to decreasing the detachment temperatures or the total implantation doses relative to implantation of hydrogen (or helium) alone.

However, surprisingly, it has been observed that, relative to implanting hydrogen alone, as described for example in the aforementioned document U.S. Pat. No. 5,374,564 (Bruel), at doses of a few $10^{16}$/cm$^2$ with energies of between 10 and 1000 keV and with a thermal cleave obtained above 500° C., additionally implanting helium and boron, under the conditions of the invention, has the advantage that the thermal cleave requires a higher thermal budget, thereby making it possible to include high-temperature technological steps without risking premature cleaving.

A fortiori, it has been observed, also surprisingly, that, relative to implanting hydrogen in combination with boron, as described for example in the aforementioned document U.S. Pat. No. 5,877,070 (Goesele), with a hydrogen dose of $10^{17}$ H/cm$^2$ with an energy of 60 or 129 keV and a boron dose representing between 0.1 % and 1% of the hydrogen dose ($5 \times 10^{14}$ B/cm$^2$ with an energy of 180 keV) and a sensitizing heat treatment at 250° C. and then cleaving at a temperature at most equal to the sensitizing temperature, additionally implanting helium, under the conditions of the invention, has the advantage of retarding the thermal cleave (or even preventing it, in which case additional energy must be supplied in mechanical form).

Likewise, in relation to a process involving the implantation of hydrogen together with helium, as described for example in the aforementioned document WO 2004/04279 with, for example, a hydrogen dose of $4.5 \times 10^{16}$ H/cm$^3$ at an energy of 30 keV and a helium dose of $2 \times 10^{16}$ He/cm$^3$ at an energy of 45 keV and a detachment cleave at 275° C., the fact of additionally implanting boron, under the conditions of the invention, has the advantage of retarding the thermal cleave (or even preventing it, in which case addition energy must be supplied in mechanical form).

In fact, the idea of a triple implantation involving hydrogen, helium and boron has already been touched on in document EP 1 798 765 (Corning), but only in a vague and imprecise way since the examples described relate only to the double-implantation case. In fact the aim of the multiple implantations proposed by this document is to reduce cost, which a priori runs counter to the retarding aim that is the basis of the technical problem addressed by the invention. A fortiori, this document neither discloses nor suggests the implantation conditions recommended by the invention or their advantages.

Advantageously, above all when detaching thin films of particularly small thickness (at most a few hundred nanometers), a step of bonding to a carrier (via intimate contact with the latter) is provided between the implantation and the cleaving detachment step (the intermediate high-temperature step, even the detachment step, may then consist of a treatment allowing the bonding interface to be strengthened). More generally, the intermediate step (it need not be a single step) is advantageously a high-thermal-budget technological step, typically involving a temperature at least equal to 450° C., even 500° C., such as a strengthening treatment but also a film deposition treatment, especially an epitaxial deposition, etc.

According to advantageous features of the invention, optionally in combination:
- the boron implantation dose is at least equal to 1% of the total dose of helium and hydrogen and at most equal to 10% of this total dose, i.e. the boron dose represents a significant but small proportion of the total dose of helium and hydrogen;
- each of the helium and hydrogen doses is preferably at least equal to $10^{15}$ atoms/cm$^2$, i.e. each of these species is present at a significant level and there is actual synergy between these species;
- the helium and hydrogen doses are advantageously in a ratio of between and 2, i.e. they are advantageously of the same order of magnitude;
- the distance between the helium and boron concentration maxima, on the one hand, and the hydrogen concentration maximum, on the other hand, is at most equal to 200 nm;
- the cleave is obtained via a cleaving heat treatment that is at least partially carried out at a temperature at least equal to 450° C., even 600° C.;
- the cleaving is induced via application of mechanical energy (an impulse or shock, insertion of a blade, torque, ultrasound, etc.).

BRIEF DESCRIPTION OF THE DRAWINGS

Aims, features and advantages of the invention will become clear from the following description, given by way of nonlimiting indication and with regard to the appended drawings in which:

FIG. 1 shows an initial substrate 10, here made of single-crystal silicon. As a variant, this substrate may especially consist of a layer of single-crystal silicon borne by a carrier substrate, for example made of polycrystalline silicon. As is conventional, this substrate 10 is here covered with a thermal oxide layer 11 obtained in prior steps (such an oxide layer may be omitted).

This initial substrate has been subjected to a triple implantation, i.e. implantation of boron, implantation of hydrogen and implantation of helium.

The order of implantation of these three species did not appear to affect the outcome of the cleaving detachment process.

The implantation energies are chosen so that the helium and boron peaks are:
- less deep than the hydrogen peak by a distance at least equal to 20 nm, advantageously at most equal to 200 nm; and
- both localized at the same depth, or located a small distance one from the other (up to 10 nm in practice).

A suitable technique for making such depth measurements appears to be secondary ion mass spectroscopy (SIMS), which gives results that are different from those that may be obtained by simulation, for example using CTRIM (crystal transport of ions in matter) software.

The implantation doses are chosen such that:
- the boron dose is at least equal to $5\times10^{13}$ B/cm$^2$, preferably at least equal to $10^{14}$ B/cm$^2$ and it is preferably below $10^{16}$ B/cm$^2$ so as to avoid amorphization of the substrate, even more advantageously this boron dose does not represent more than 10% of the combined dose of hydrogen and helium; and
- the total dose of hydrogen and helium (H dose+He dose) is at least equal to $10^{16}$/cm$^2$, preferably at most equal to $4\times10^{16}$/cm$^2$ and advantageously at most equal to $3\times10^{16}$/cm$^2$.

Thus the boron dose is advantageously between 1 and 100 times lower than the cumulative H+He dose.

The future thin film is located between the surface through which the implantations are carried out and the helium and boron peaks (where the damage caused by the implantations is very largely concentrated (this damage may alter between this triple implantation and the cleaving)).

Similarly to the known Smart Cut™ process, the substrate 10 is then (see FIG. 2) advantageously brought into intimate contact with a carrier 12, here a substrate of the same nature as the initial substrate 10, namely single-crystal silicon (it may also be covered, over its surface facing the substrate 10, with an oxide layer (not shown)). This contact advantageously occurs via direct bonding and a heat treatment may then be used to reinforce this bonding, before the detachment of the thin film.

Figure 1:
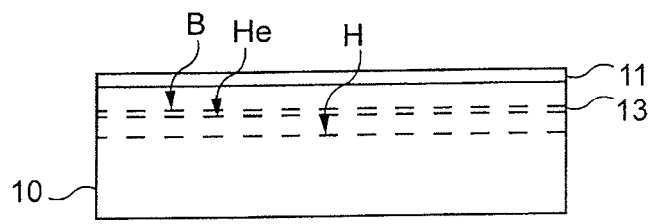
FIG. 1 is a schematic cross-sectional view of a substrate that has been subjected to an implantation step of the process of the invention.
Figure 2:
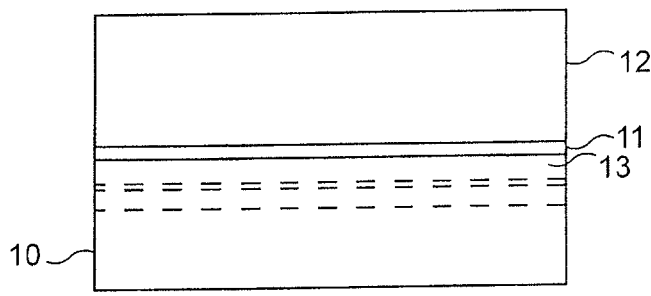
FIG. 2 is a similar view after a step of bringing the substrate of FIG. 1 into intimate contact with a second substrate.

In FIG. 2, the reference 13 denotes a weakened layer resulting from the aforementioned triple implantation and possible heat treatments undergone during these implantations or afterward, for example for strengthening the bond to the carrier.

Figure 3:
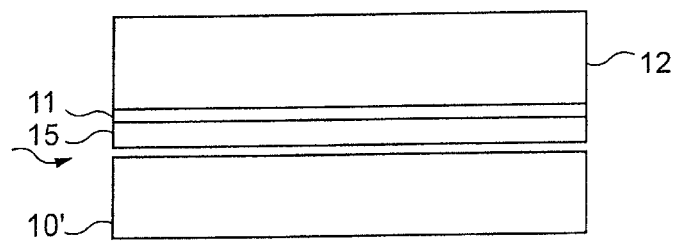
FIG. 3 is a similar view after a cleaving step.

Next, (see FIG. 3), the cleaving is induced at the weakened layer 13, substantially at the boron and helium implantation, by applying thermal energy possibly supplemented by another form of energy (schematized by an arrow), for example by applying a detaching stress (for example inserting a blade between the two substrates and/or applying tensile and/or flexural and/or shear forces and/or by applying ultrasound or microwaves of judiciously chosen power and frequency). Thus a thin film 15 consisting of the initial-substrate part that remains attached to the second substrate 12, and a leftover of the initial substrate, here denoted 10', are obtained.

Figure 4:
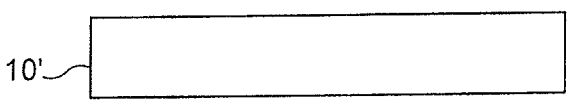
FIG. 4 is a similar view showing the initial substrate ready for a new cycle of implementing the process of the invention.

This leftover may then be used for another implantation-bonding-cleave cycle (FIG. 4) after optional recycling, for example using a suitable polish and/or heat treatment.

Experimental Results

The recommended operating conditions for the triple implantation are based on the following results.

Effect of the Implantation Order

Implantation operating conditions were set, by way of reference, as follows:
boron (80 keV and $10^{15}$/cm$^2$), helium (34 keV and $1.2\times10^{16}$/cm$^2$), hydrogen (27 keV and $1.2\times10^{16}$/cm$^2$).

Anneals were then carried out at 500° C. for 10 min or 700° C. for 10 min in order to assess the effect of these operating conditions.

The implantations were carried out in the following orders:
B then He then H;
B then H then He;
H then B then He;
H then He then B;
He then H then B; and
He then B then H.

These various combinations in implantation order, all other things being equal, both for the heat treatment at 500° C. (10 min) and for that at 700° C. (10 min), led to identical results, i.e. the absence of blistering at the end of the anneal, meaning that there had been no untimely cleaving before the end of the heat treatment, that these implantation conditions did not lead to a thermal cleave after 10 min at 500° C. or likewise at 700° C., and that to obtain a cleave it was even useful to apply another form of energy, especially mechanical energy.

It is however worth mentioning that, in the absence of such a triple implantation, the cleaving would occur more rapidly. Thus, by way of example, in the case of hydrogen implantation alone, with a similar dose to the aforementioned total helium and hydrogen dose, or in the case of implantation of hydrogen and helium without boron, a purely thermal cleave (i.e. no additional mechanical energy) was obtained after about 10 minutes at 500° C. In the case of implantation of hydrogen and boron without helium, a purely thermal cleave was obtained after approximately 11 seconds at 500° C. With the triple implantation recommended by the invention, a thermal cleave was observed only after two hours at 500° C.

Although it is not known for certain, it seems that, whereas implantation of hydrogen alone leads to defects that may be approximated to elongate cavities of the microcrack type having a length of about 50 to 100 nm in the plane of weakness, the triple implantation of the invention, for its part, leads instead to defects that are on the whole spherical and about 10 nm to 20 nm in diameter.

Effect of Helium Implantation Energy and Hydrogen Implantation Energy

To assess the effect of helium implantation energy the operating conditions were set, by way of reference, as follows, analogously to those mentioned above:
boron (80 keV and $10^{15}/cm^2$), helium (variable energy and $1.2 \times 10^{16}/cm^2$), hydrogen (27 keV and $1.2 \times 10^{16}/cm^2$)

The effect of the implantation was, as above, assessed by means of anneals at 500° C. for 10 min or 700° C. for 10 min.

On decreasing the He implantation energy from 55 keV to 24 keV it was observed that:
when the energy was decreased from 55 keV to 34 keV, the blistering that was observed at the highest energy tended to reduce;
when the energy was 34 keV, there was no blistering;
when the energy was then decreased, from 34 to 24 keV, the blistering increased.

Thus, implantation of helium at 34 keV corresponds to a maximum retardation of the thermal effect contributing to the detachment cleave, and this retardation is less and less effective the further the energy is from this optimal value, whether above or below it. In other words, there appears to be an optimal implantation depth (about 200 nm, according to the table below, in the case of silicon covered with a thermal oxide layer 100 nm in thickness, i.e. 100 nm below this layer) which corresponds to the implantation depth of the boron.

To assess the effect of hydrogen implantation energy, the operating conditions were set, by way of reference, as follows (analogously to those defined above):
boron (80 keV and $10^{15}/cm^2$), helium (34 keV and $1.2 \times 10^{16}/cm^2$), hydrogen (variable energy and $1.2 \times 10^{16}/cm^2$); and
anneals at 500° C. for 10 min or 700° C. for 10 min.

On decreasing the H implantation energy from 50 keV to 20 keV (i.e. substantially the same variation range as for the helium) it was observed that:
when the energy was decreased from 50 to 27 keV, there was no blistering; and
when the energy was then decreased from 27 to 20 keV, the blistering increased.

Thus, implantation of hydrogen at an energy of 50 keV to 27 keV corresponds to a maximum retardation of the thermal effect contributing to the detaching cleave, and this retardation is less and less effective the further the energy is decreased below 27 keV. In other words, there appears to be a minimum implantation depth (about 230 nm, according to the table below, in the case of silicon covered with a thermal oxide layer 100 nm in thickness, i.e. 130 nm beneath this layer).

The results obtained by implanting helium with energies varying above or below 34 keV, hydrogen with energies above or below 27 keV, or boron at the aforementioned optimal value, are given in the following table for donor substrates made of single-crystal silicon covered by a thermal oxide layer 10 nm in thickness. The quantity Cmax corresponds to the depth at which the implantation density is a maximum (simulated using the CTRIM software and measured using SIMS).

| Ion/Energy | Cmax depth (SIMS) | Cmax depth (CTRIM) |
| --- | --- | --- |
| Boron 80 keV | 195 nm | 190 nm |
| Hydrogen 20 keV | 190 nm | 200 nm |
| Hydrogen 27 keV | 230 nm | 253 nm |
| Hydrogen 40 keV | 346 nm | 370 nm |
| Hydrogen 50 keV | 400 nm | 447 nm |
| Helium 25 keV | 134 nm | 185 nm |
| Helium 34 keV | 200 nm | 265 nm |
| Helium 45 keV | 280 nm | 340 nm |
| Helium 55 keV | 334 nm | 400 nm |

The constraints on the relative positions of the various peaks were defined on the basis of the SIMS measurements. It seems that it is the position of the boron peak that determines the thickness of the future thin film.

Effect of Boron, Helium and Hydrogen Implantation Doses

To assess the effect of the boron implantation dose the operating conditions were set as follows (analogously to those defined above):
boron (80 keV with a variable dose), helium (34 keV and $1.2 \times 10^{16}/cm^2$), hydrogen (27 keV and $1.2 \times 10^{16}/cm^2$); and
anneals at 500° C. for 10 min or 700° C. for 10 min.

With a boron concentration between $6 \times 10^{14}$ at/cm$^3$ and $10 \times 10^{14}$ at/cm$^3$, corresponding to a dose per unit area of barely $10^{10}$ at/cm$^2$, i.e. a very low dose, a conventional cleave was observed, such as is especially observed with a simple hydrogen implantation involving microcrack-type defects.

If the boron dose (and therefore concentration) was increased by an order of magnitude (by multiplying by about a factor of 10), it was observed that the cleaving was accelerated.

Increasing once more, by implantation, the dose (concentration) of boron by an order of magnitude to the order of $10^{13}$ at/cm$^2$ (about $6 \times 10^{17}$ at/cm$^3$) led to cleave retardation, meaning that the cleaving time was increased by a factor of 3 or that it was possible to increase the cleaving anneal temperature by about 25° C. while preserving the same length of time before the cleaving occurred. It will be understood that the effect of the invention begins to appear from this order of magnitude; however, it was observed that there was still a risk of untimely cleaving during application of certain high-temperature technological steps, so that it seems preferable to locate the dose above this threshold.

Increasing the boron dose once more by an order of magnitude, to the order of $10^{14}$ at/cm$^2$ ($6 \times 10^{19}$ at/cm$^3$) was observed to have the effect of preventing thermal cleaving. Specifically, the cleaving after an anneal at temperatures from 600° C. to 900° C. for 1 h was not enough by itself to induce the cleaving, and it was necessary to add another form of energy (by inserting a blade).

This thermal-cleave prevention was also observed, even without blistering, at an even higher dose, higher by an order of magnitude, i.e. $10^{15}$/cm$^2$ ($6 \times 10^{19}$ at/cm$^3$).

It thus appears that below a boron dose of $10^{13}$ at/cm$^2$ the presence of boron interferes with the objective of the invention, but that above this dose the presence of boron, in combination with hydrogen and helium, contributes to retard the alteration, for the same one or more heat treatments, of the layer of microcavities and therefore the cleaving. The retarding effect is particularly noticeable from $10^{14}$ at/cm$^2$ and should also occur at higher doses, especially of the order of $10^{15}$ at/cm$^2$ (however, it is not recommended to increase the boron dose much above this range, on account of other effects that the boron may have, especially in terms of amorphization).

To assess the effect of the hydrogen implantation dose the operating conditions were set, by way of reference, as follows (analogously to those defined above):
boron (80 keV and $10^{15}$ at/cm$^2$), helium (34 keV and $1 \times 10^{16}$ at/cm$^2$), hydrogen (27 keV with a variable dose); and
anneals at 500° C. for 10 min or 700° C. for 10 min.

It was observed that, as the dose was decreased from $4 \times 10^{16}$ at/cm$^2$ to $1 \times 10^{16}$ at/cm$^2$ the blistering reduced until becoming imperceptible at $10^{16}$ at/cm$^2$.

Thus, all conditions being otherwise similar, a hydrogen dose of about $10^{16}$ at/cm$^2$ (of course encompassing the value of $1.2 \times 10^{16}$ at/cm$^2$ mentioned in the reference conditions given above) appears to be an optimum dose (below this dose the dose is no longer high enough to produce a layer of microcavities that is sufficiently regular to obtain, finally, a satisfactory surface finish after cleaving detachment).

To assess the effect of the helium implantation dose the operating conditions were set, by way of reference, as follows (analogously to those defined above):
boron (80 keV and $10^{15}$ at/cm$^2$), helium (34 keV and with a variable dose), hydrogen (27 keV and $1 \times 10^{16}$ at/cm$^2$); and
anneals at 500° C. for 10 min or 700° C. for 10 min.

It was observed that, as the helium dose was decreased from $4 \times 10^{16}$ at/cm$^2$ to $1 \times 10^{16}$ at/cm$^2$ the blistering initially increased (between $4 \times 10^{16}$ at/cm$^2$ and $3 \times 10^{16}$ at/cm$^2$) and then decreased until it was no longer really perceptible at $1 \times 10^{16}$ at/cm$^2$.

Thus, all conditions being otherwise similar, a helium dose of about $10^{16}$ at/cm$^2$ (of course encompassing the value of $1.2 \times 10^{16}$ at/cm$^2$ mentioned in the reference conditions given above) appears to be an optimum dose (below this dose the dose is no longer high enough to produce a layer of microcavities that is sufficiently regular to obtain, finally, a satisfactory surface finish after cleaving detachment).

More generally, it will be understood that a particularly advantageous operating range for the triple implantation, in any order, is defined as follows:
the implantation energies are such that:
helium and boron concentration maxima are obtained at substantially the same depth, separated by at most 10 nm; and
these maxima are less deep than the hydrogen concentration maximum,
and the implantation doses are such that:
the boron dose is at least equal to $10^{13}$ B/cm$^2$ (typically at least equal to $5 \times 10^{13}$ B/cm$^2$); and
the total dose of helium and hydrogen is between $10^{16}$ atoms/cm$^2$ and $4 \times 10^{16}$ atoms/cm$^2$, preferably at most $3 \times 10^{16}$ atoms/cm$^2$.

A few exemplary implementations of the invention are described below, for the case of silicon.

EXAMPLE 1

A single-crystal-silicon substrate of (100) crystal orientation, coated with an SiO$_2$ thermal oxide layer 100 nm in thickness is implanted under the following conditions: boron (80 keV and $10^{15}$ at/cm$^2$)+helium (34 keV and $1.2 \times 10^{16}$ at/cm$^2$)+hydrogen (27 keV and $1.2 \times 10^{16}$ at/cm$^2$). The implanted substrate is then deoxidized and then bonded to a (110) single-crystal Si substrate using standard hydrophobic direct bonding (HF deoxidation then HF-last (meaning that HF was applied at 1% for 30 seconds before drying under nitrogen)). Since the bonding energy is then low at room temperature (20 mJ/m$^2$), this bond next has to be reinforced at 700 to 800° C. so as to withstand the subsequent film transfer, the bonding energy then reaching about 1.5 to 2 J/m$^2$. The cleaving heat treatment (which simultaneously strengthens the bonding interface) then consists for example of a long anneal: from room temperature to 800° C. with a ramp-up of 0.25 to 5° C./min, optionally with 2 to 6 hour long plateaus every 100° C. and then a slow temperature ramp-down at a rate of 0.25 to 3° C./min. This heat treatment does not induce the cleaving by itself—the latter is induced mechanically by inserting a blade into the bonding interface. A (100) Si film of about 225 nm (~225 nm) in thickness joined to a (110) Si substrate is obtained, which film may be used to produce advanced microelectronic components.

It will be noted that the implantation conditions correspond, at least approximately, to the optimum conditions indicated above.

It will be appreciated that, despite the great length of time of the high-temperature treatment (several hours above 600° C.), the timing of the detachment cleave is well controlled, the cleave only occurring on inserting a blade. In contrast, in the absence of the triple implantation provided by the invention, it is certain that an untimely thermal cleave would be observed from low temperatures, below 500° C., during the heat treatment so that it would be impossible to reinforce the bonding interface (a defective thin film being the result) (NB: it may be advantageous to use one and the same heat treatment at 800° C. to ensure both the reinforcement of the bonding interface and the cleave).

EXAMPLE 2

An Si substrate is implanted under the following conditions: boron (150 keV and $5 \times 10^{14}$ at/cm$^2$)+helium (65 keV and $10^{16}$ at/cm$^2$)+hydrogen (60 keV and $2 \times 10^{16}$ at/cm$^2$). A thick film (~10 to 50 μm thick) of single-crystal Si is then grown by liquid phase epitaxy (LPE) on the implanted substrate at 700° C. A HIT (heterojunction with intrinsic thin layer) technology, which may be used to produce solar cells, is then produced. The epitaxially grown surface thus processed is then bonded to a thin metal film (aluminum or steel foil) by means of a metallic paste or a conductive polymer and the cleave is induced mechanically at the implanted zone by applying mechanical forces (peeling, ultrasound, tensile forces, shear forces, etc.). In this way a single-crystal Si photovoltaic cell ~10 to 50 μm in thickness is obtained.

It should be noted that the implantation conditions correspond, relative to those of example 1, to a boron implantation of higher energy but of half the dose, to a helium implantation of the same dose but with nearly double the energy, and to a hydrogen implantation with a dose and energy that are both nearly doubled. However, the implantation depths are substantially the same for the helium and boron (about 500 nm), less than the depth of the hydrogen implantation by a distance which is possibly about 70 nm.

It will be appreciated that, despite the existence of high-temperature treatments, for epitaxial growth and for the formation of useful components, the timing of the detaching cleave is well controlled, the cleave only occurring on insertion of a blade. In contrast, in the absence of the triple implantation according to the invention, it is certain that blistering or exfoliation of the substrates would have been observed (blistering impairs the quality of the epitaxial film whereas exfoliation results in loss of the implanted zone and therefore decreased weakness making control of the cleaving more random).

EXAMPLE 3

An Si substrate is implanted under the following conditions: boron (80 keV and $10^{14}$ at/cm$^2$)+helium (34 keV and $1.2 \times 10^{16}$ at/cm$^2$)+hydrogen (27 keV and $1.2 \times 10^{16}$ at/cm$^2$). The implanted substrate is then subjected to one or more technological steps involving an anneal at 500° C. for a total length of time of 1 h30. These technological steps may consist for example in deposition of a thick bonding layer (SiO$_2$, Si$_3$N$_4$, polycrystalline Si) followed for example by a densifying anneal at 500° C. The implanted and processed substrate is then bonded to a supporting substrate by direct bonding. The cleave is then thermally induced by an isothermic anneal at 600° C. for 10 min.

It will be noted that, relative to the optimal conditions given above, the boron dose is ten times less. However, despite the various heat treatments undergone, the timing of the detachment cleave is well controlled, here only thermally at least 600° C. However, in the absence of such a triple implantation it is certain that blistering or exfoliation would have been observed, as was described with regard to example 2.

The invention claimed is:

1. A process for detaching a silicon thin film from a donor substrate by cleaving, said process comprising: implanting species within the donor substrate through a free surface to form a weak layer, the donor substrate being at least in part located below the free surface, said species being implanted at a depth at least equal to the thickness of the thin film to be detached; performing heat treatment at a temperature of at least 450° C.; and cleaving along the weak layer, wherein implanting species comprises implanting boron, helium and hydrogen in any order with implantation energies such that: helium and boron concentration maxima are obtained at substantially the same depth, separated by at most 10 nm; and a hydrogen concentration maximum is obtained at a depth at least 20 nm greater than that of the helium and boron concentration maxima, and with implantation doses such that: the boron dose is at least equal to $5 \times 10^{13}$ B/cm$^2$; and the total dose of helium and hydrogen is at least equal to $10^{16}$ atoms/cm$^2$ and at most equal to $4 \times 10^{16}$ atoms/cm$^2$.

2. The process of claim 1, further comprising bonding the free surface with a carrier.

3. The process of claim 1, wherein the boron implantation dose is at least equal to 1% of the total dose of helium and hydrogen and at most equal to 10% of the total dose of helium and hydrogen.

4. The process of claim 1, wherein each of the helium and hydrogen doses is at least equal to $10^{15}$ atoms/cm$^2$.

5. The process of claim 4, wherein the ratio of the helium and hydrogen doses is between ½ and 2.

6. The process of claim 1, wherein the distance between at least one of the helium concentration maximum and the boron concentration maximum is less than or equal to 200 nm.

7. The process of claim 1, wherein said cleaving along the weak layer comprises carrying out a cleaving heat treatment that is at least partially carried out at a temperature at least equal to 450° C.

8. The process of claim 1, wherein said cleaving along the weak layer comprises carrying out a cleaving heat treatment that is at least partially carried out at a temperature at least equal to 600° C.

9. The process of claim 1, wherein said cleaving along the weak layer comprises inducing cleavage via application of mechanical energy.

10. The process of any one of claim 1, wherein the total dose of helium and hydrogen is at most equal to $3 \times 10^{16}$ atoms/cm$^2$.

* * * * *